US 6,661,264 B2

(12) United States Patent
Moyal et al.

(10) Patent No.: US 6,661,264 B2
(45) Date of Patent: Dec. 9, 2003

(54) RELEASING FUNCTIONAL BLOCKS IN RESPONSE TO A DETERMINATION OF A SUPPLY VOLTAGE PREDETERMINED LEVEL AND A LOGIC PREDETERMINED INITIAL STATE

(75) Inventors: Nathan Y. Moyal, Austin, TX (US); James R. Feddeler, Austin, TX (US); Michael Kent, Austin, TX (US); Raha K. Prasun, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/967,180

(22) Filed: Sep. 28, 2001

(65) Prior Publication Data
US 2003/0062934 A1 Apr. 3, 2003

(51) Int. Cl.[7] ............................................. H03K 17/22
(52) U.S. Cl. ........................................ 327/143; 327/198
(58) Field of Search ................................. 327/143, 198

(56) References Cited

U.S. PATENT DOCUMENTS

| | | | | |
|---|---|---|---|---|
| 4,338,529 A | * | 7/1982 | Fujibayashi | 327/100 |
| 4,419,596 A | * | 12/1983 | Kikuchi | 327/143 |
| 4,581,552 A | * | 4/1986 | Womack et al. | 327/142 |
| 5,166,545 A | * | 11/1992 | Harrington | 327/143 |
| 5,801,568 A | * | 9/1998 | Young | 327/143 |
| 5,892,381 A | * | 4/1999 | Koifman et al. | 327/143 |
| 6,107,847 A | * | 8/2000 | Johnson et al. | 327/143 |
| 6,111,441 A | * | 8/2000 | Hartley et al. | 327/143 |
| 6,144,237 A | * | 11/2000 | Ikezaki | 327/143 |
| 6,157,227 A | * | 12/2000 | Giovinazzi et al. | 327/143 |

* cited by examiner

Primary Examiner—Terry D. Cunningham
(74) Attorney, Agent, or Firm—Trop, Pruner & Hu, P.C.

(57) ABSTRACT

An integrated circuit may be initialized by determining that the supply voltage is ramping up and resetting logic in the integrated circuit to a predetermined initial state using a reset signal. After the logic is determined to be in its initial state and the supply voltage is established, the reset signal may be latched off.

24 Claims, 4 Drawing Sheets

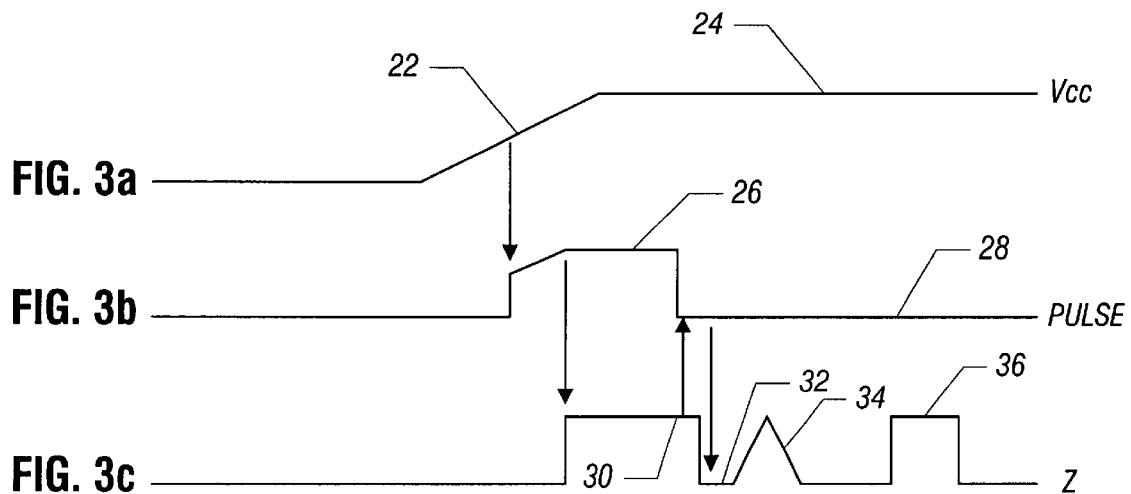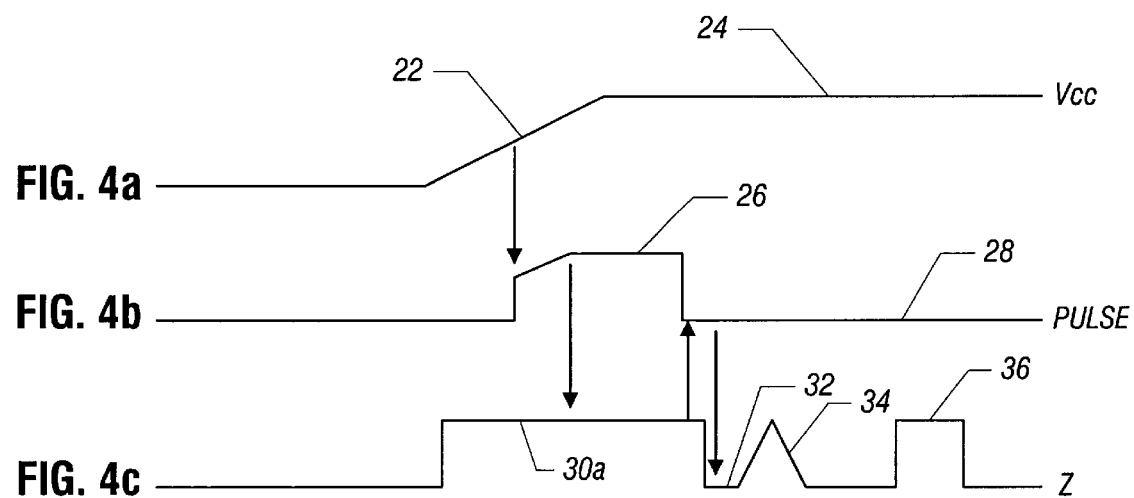

RELEASING FUNCTIONAL BLOCKS IN RESPONSE TO A DETERMINATION OF A SUPPLY VOLTAGE PREDETERMINED LEVEL AND A LOGIC PREDETERMINED INITIAL STATE

BACKGROUND

This invention relates generally to integrated circuits and particularly to systems for starting up integrated circuits.

During the start-up cycle of an integrated circuit, the supply voltage ramps up. A power-on reset circuit generally asserts reset whenever the supply voltage falls below a threshold. Moreover, the reset circuit asserts a reset until the supply voltage has risen above the threshold for a suitable interval. The operation of the power-on reset circuit prevents various integrated circuits such as counters, phase-locked loops, filters, memories, flip-flops, and shift registers, as a few examples, from operating improperly during start-up operation.

In some cases, such as those involving complex logic patterns or unexpected data patterns, an integrated circuit may be determined, incorrectly, to be in a ready state. It may be desirable to only release the circuit when it is in its predetermined state. In some cases, the power-on reset circuits may release logic when the power supply has maintained its threshold level for a predetermined time even though the circuit's logic is not in its predetermined state. Conversely, the power-on reset circuit may improperly release the integrated circuit because the logic is in the predetermined state even though the power supply level is still ramping.

Thus, there is a need for a system that does not prematurely release an integrated circuit.

BRIEF DESCRIPTION OF THE DRAWINGS

FIGS. 3a through 3c are timing diagrams for a plurality of signals in accordance with one hypothetical embodiment;

FIGS. 4a through 4c are timing diagrams for signals in accordance with another hypothetical embodiment;

DETAILED DESCRIPTION

Figure 1:
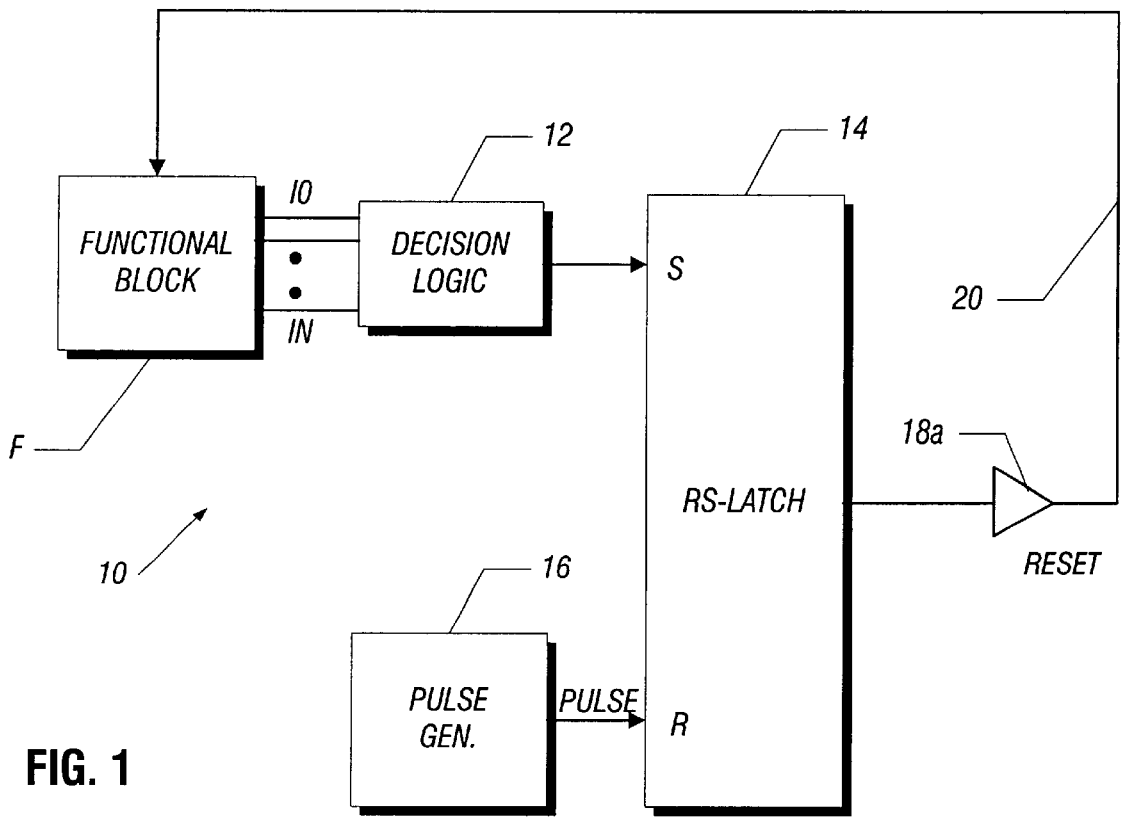
FIG. 1 is a block diagram of one embodiment of the present invention.

Referring to FIG. 1, a functional block F may be controlled by a power-on reset circuit 10 to prevent its release for normal operation prior to the time that both the power supply has stabilized and the logic in the functional block F has transitioned to predetermined logic states. The power-on reset circuit 10, in one embodiment, may include the decision logic 12, a latch 14, a pulse generator 16, and an amplifier 18a that couples a signal feedback 20 back to the functional block F. The circuit 10 may be integrated on the same chip as the block F in one embodiment.

The functional block F may generate a plurality of output signals $I_0$ through $I_N$. Each of the signals is received by the decision logic 12 so that the decision logic 12 can determine whether the logic of the functional block F is in the proper predetermined, initial states to begin normal operation.

During start-up, the signals $I_0$ through $I_N$ may be in some random state where it is highly probable that at least some of these signals are high and some are low. The decision logic 12 yields a low output to the S node of the latch 14 if one or more of the outputs $I_0$ to $I_N$ of the functional block F is not in its predetermined state. The decision logic tests the signals $I_0$ to $I_N$ to determine whether those signals are in their proper initial states.

Meanwhile, the pulse generator 16 initially generates a high pulse into the R node of the latch 14 when the supply voltage is ramping up. The combination of a low S node and high R node may result in a reset signal being sent to the functional block F through the amplifier 18a and the signal feedback 20. Thus, the pulse generator 16 may trigger the latch 14 to generate the reset signal to place the logic in the functional block into correct initial states.

The reset signal resets the logic in the functional block F to a desired predetermined state. As a result, the outputs $I_0$ through $I_N$ yield known good states. When these good states are detected by the decision logic 12, this results in the latch 14 node S going high. The reset signal remains active until the node S has become high, indicating that the functional block's logic is ready, and the pulse generator 16 signal has gone away, indicating that the power supply is now fully operational.

When the pulse generator 16 signal is gone and logic indicates ready (S node=1), normal chip operation begins in the functional block F. If the logic in the functional block F is not ready, for example due to long routing or for some other reason, the reset remains active, preventing normal operation of the function block F.

After the logic in the functional block F is released, the decision logic 12 may indicate a faulty ready state. This may be the result of complex logic patterns or unexpected data patterns, as two examples. The reset signal is not improvidently activated since it is latched into a deactive state by the latch 14 until the power cycles. The latch 14 releases from its deactivated state (no reset) only if the pulse generator 16 indicates that the power supply is ramping.

Figure 2:
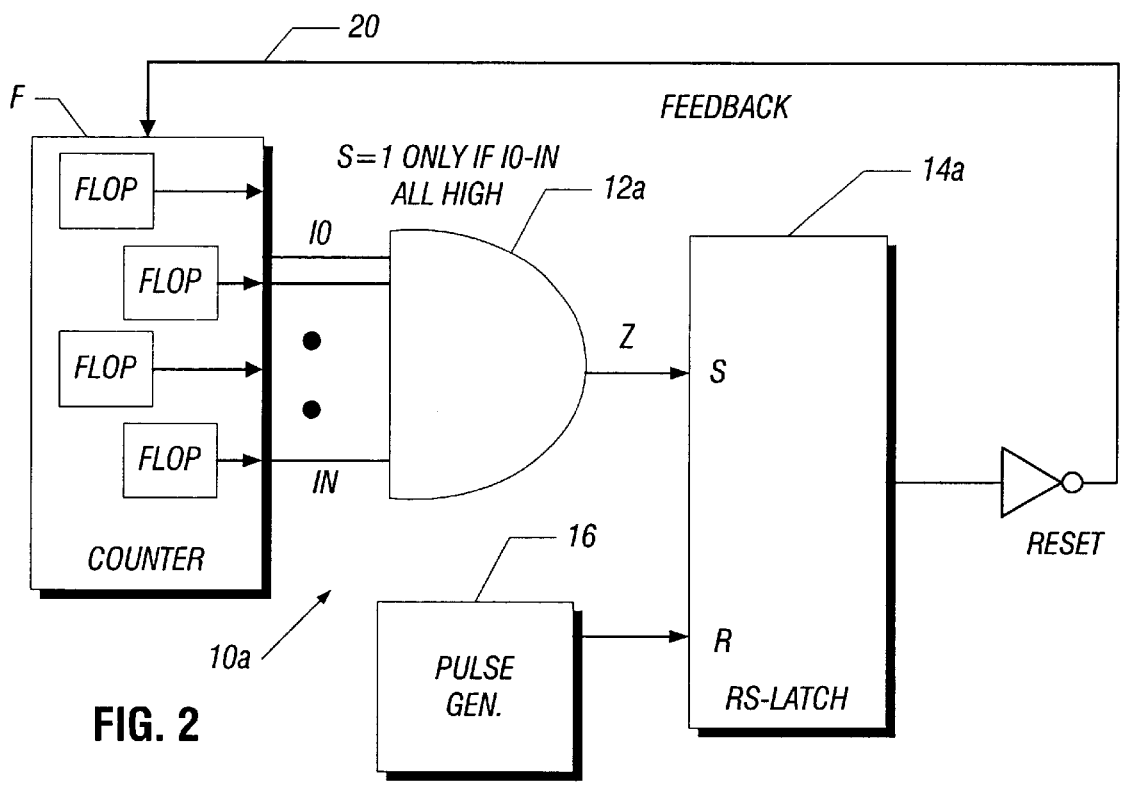
FIG. 2 is a block diagram of one embodiment of the present invention.

Referring, next to FIG. 2, the functional block F in this example is a counter having logic in the form of a plurality of flops only a few of which are shown. The reset signal (on feedback 20) to the flops is generated as soon as the pulse generator 16 is activated. The reset signal is active regardless of the indication from the logic within the functional block F. This is a desirable property because during start-up it is possible to have faulty indicators from the functional block F.

The feedback signal 20 resets the counter to a predetermined state. The counter sends an "all high" signal to the AND gate 12a (which acts as the decision logic) once all the flops are in their required logic states. Once the pulse generator 16 signal is gone (R=0), and the counter has indicated ready (S=1) the reset signal goes away. When the S and R inputs are zero or the R signal is one, the reset signal is active.

Potentially, the output of the AND gate 12a may be switched between low and high levels due to normal logic operation of the counter which accidentally happens to instantaneously yield the correct initial, all high condition. However, the latch 14a will not reactivate because it has been latched to its deactive (no reset) state.

Referring to FIGS. 3a through 3c, the power supply signal Vcc shown in FIG. 3a ramps up at 22 (when turned on) to a Vcc level 24. During the ramping (at 22), as shown in FIG. 3b, the pulse generator 16 signal undergoes the transition to the high level 26 causing the functional block logic to go to "ready" (S=1), as indicated at 30 in FIG. 3c. When the pulse generator 16 signal is high (FIG. 3b) the logic AND is high (FIG. 3c), the pulse generator 16 signal goes low (R=0) as indicated at 28. The pulse generator 16 signal being low causes the reset signal to go low releasing the logic in the functional block F, as indicated at 32 in FIG. 3c. Logic glitches, indicated at 34 and 36, do not reactivate the reset signal, in one embodiment of the present invention, due to the latching action.

In the event that the $I_0$ through $I_N$ AND signals indicate a high prior to the pulse generator 16 signal high 26, as indicated in FIGS. 4b and 4c, the circuit 10 still functions correctly in one embodiment. For example, as shown in FIG. 4a, during the ramp indicated at 22, the pulse generator 16 signal goes high as indicated at 26 in FIG. 4b. Since the pulse generator 16 signal is high and the logic AND is high, the pulse generator 16 signal goes low as indicated at 28. The reset low results, causing the logic to release. Again logic glitches indicated at 34 and 36 do not reactivate the reset signal.

The use of the latch 14 may be advantageous in some embodiments since it useful for noise protection in low voltage applications. Noise on the supply or noise coupled from other lines may cause bouncing on critical nodes. This bouncing may trigger the next stage to unexpectedly change state.

The functional blocks may be comprised of dynamic or static logic. In addition, the functional block may be a phase-locked loop (PLL). By allowing dynamic logic, the state of the blocks that are used for normal operation may be monitored. Once they operate normally (reset is gone), they do not retrigger the reset pulse because of the latching operation.

Figure 5:
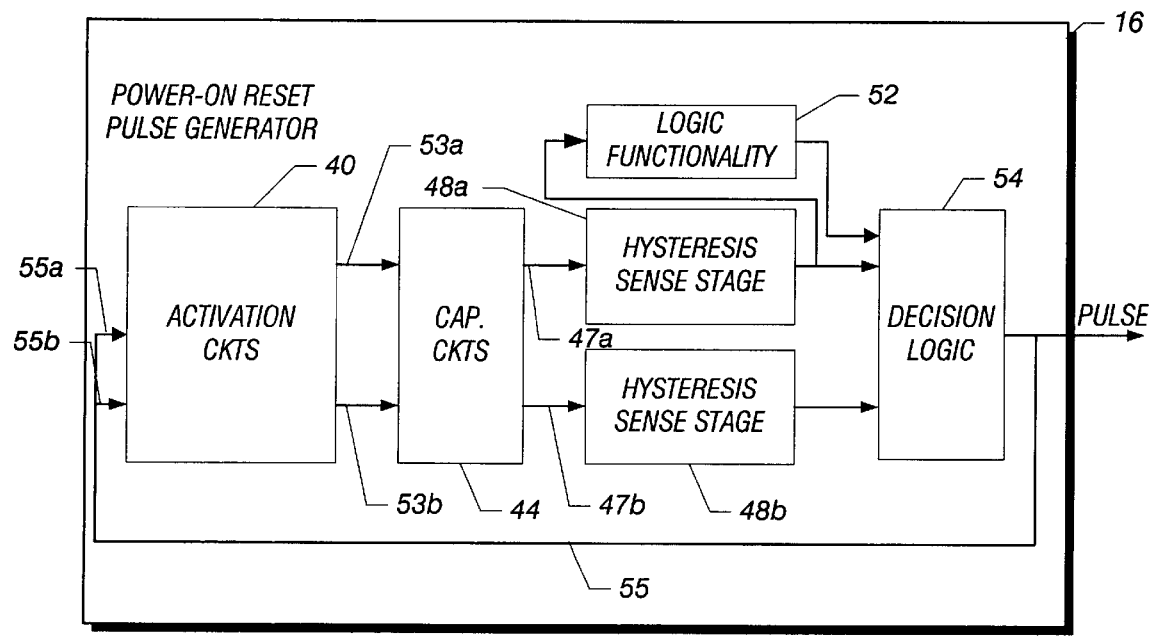
FIG. 5 is a block diagram for a chip for generating a power-on reset pulse in accordance with one embodiment of the present invention.

Referring to FIG. 5, in accordance with one embodiment of the present invention, a particular pulse generator 16 is described. However, the present invention is in no way limited to the particular design depicted in FIG. 5. A variety of pulse generator 16 designs may be utilized in the embodiments shown in FIGS. 1 and 2.

The pulse generator 16 shown in FIG. 5 includes activation circuits 40 that handle the feedback of the output pulse from pulse generator 16 along the line 55. In particular, the activation circuits 40 receive the feedback of the output pulse so that, once the pulse generator 16 signal goes away, the pulse generator 16 is not inadvertently reactivated. The activation circuits 40 may also ensure that a predetermined supply voltage level is achieved before beginning the power on reset pulse generator 16 operation in one embodiment.

Figure 6:
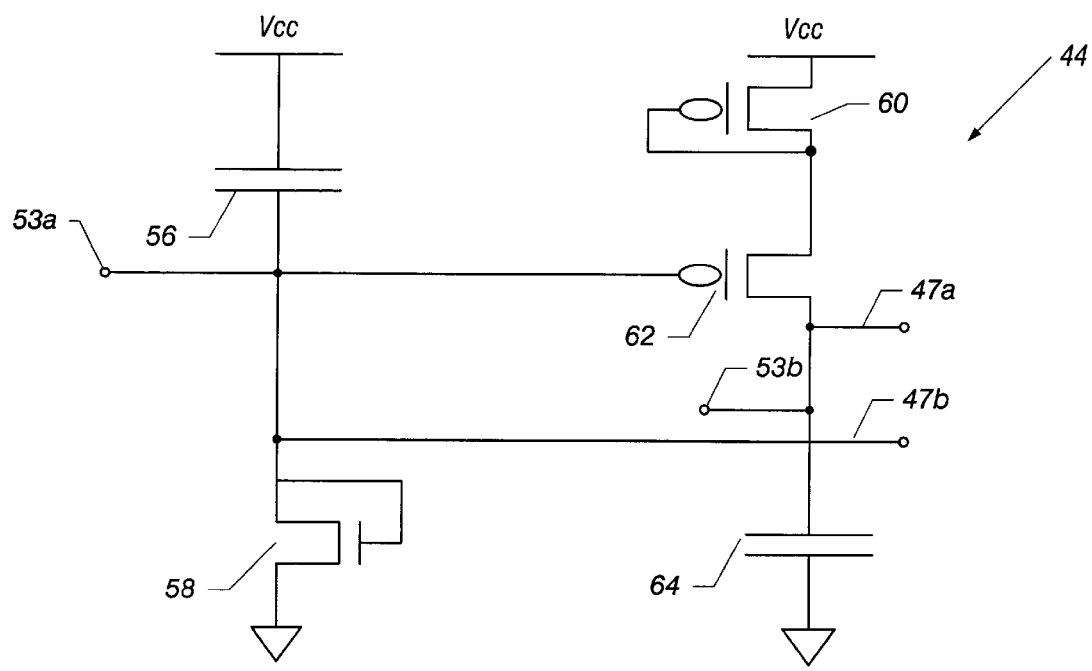
FIG. 6 is a circuit diagram for one of the blocks shown in FIG. 5 in accordance with one embodiment of the present invention.

The activation circuits 40 provide outputs 53a and 53b to the capacitor circuits 44. A variety of known capacitor circuits 44 may be utilized in some embodiments of the present invention. One capacitor circuit 44, shown in FIG. 6, receives the supply voltage Vcc at the node 53a through the capacitor 56. The Vcc-connected capacitor 56 is pulled to Vcc. A capacitor 64, coupled to Vss (or ground), remains at ground initially.

The capacitor 56 slowly discharges to ground through the transistor 58 which acts as a current source. Meanwhile, the capacitor 64 begins to charge up to Vcc through the low current transistor 60 and the pass gate transistor 62. Therefore, the capacitor circuits 44 count on the current to charge up or down each capacitor 56 or 64 above the trip point of the ensuing hysteresis sense stages 48. In addition, the capacitor 64, charging towards Vcc, depends on the capacitor 56 that is charging to ground before the capacitor 64 begins charging through the pass gate transistor 62.

After the supply voltage has reached its designated output level for the desired time period, the output 47a is high and the output 47b is low in one embodiment. These signals are conveyed to the hysteresis sense stages 48a and 48b. The output of the hysteresis sense stage 48a may be coupled to a logic functionality 52.

The logic functionality 52 determines whether the signal is at an appropriate level to accurately trigger the logic in the functional blocks being initialized. While a variety of different techniques may be utilized for testing the output of one or more hysteresis sense stages 48, in one embodiment, the most difficult logic to trigger may be emulated in the logic functionality 52. In some embodiments, the toughest logic is an inverter-like stage with stacked p-channel transistors because such a stage has particularly poor headroom.

If the power supply voltage level is too low, the decision logic 54 yields a pulse that may be applied as indicated in FIG. 1 for example. The decision logic 54 receives signals from the hysteresis sense stages 48a and 48b. The decision logic 54 generates a high pulse if the ground connected capacitor 64 did not charge up to Vcc or the power connected capacitor 56 did not charge up to Vss or the functional logic 52 did not pass the signal. The pulse generator 16 continues during the power supply ramp up. When that ramp up is over for a sufficient period of time, the decision logic 54 causes the pulse generator 16 output to go away.

Figure 7:
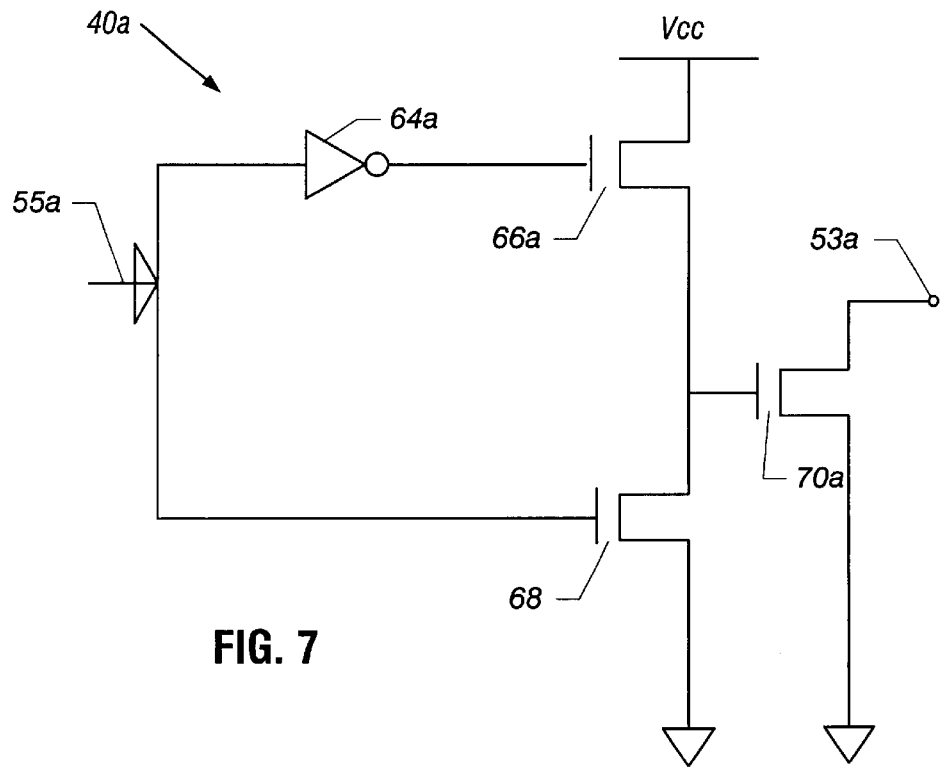
FIG. 7 is a circuit diagram for additional blocks in the block diagram shown in FIG. 5 in accordance with one embodiment of the present invention.
Figure 8:
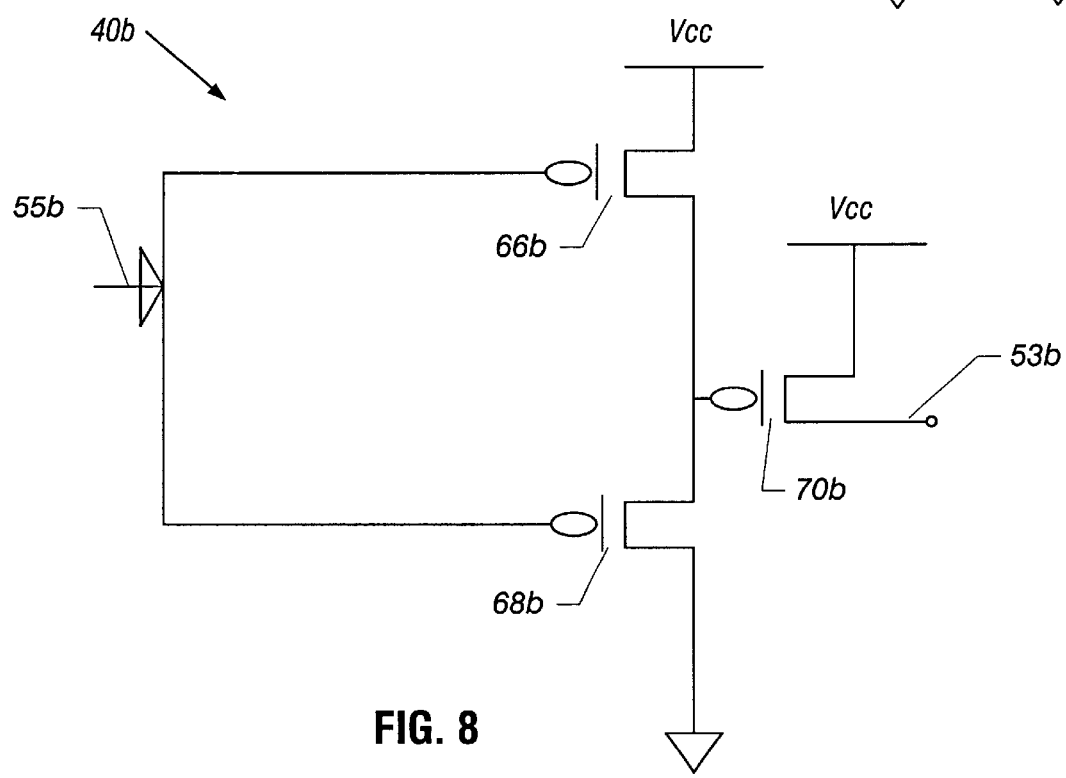
FIG. 8 is a circuit diagram for another embodiment of the present invention.

FIGS. 7 and 8 show activation circuits 40 in accordance with one embodiment. The activation circuit 40a receives the feedback signal 55a. In the case where the output pulse is low, meaning that the pulse generator 16 pulse has gone away because the desired power supply conditions have been meet, the inverter 64a inverts the low input signal 55a to a high output on the gate of the N-channel transistor 66a. This enables the transistor 66a to conduct. If the supply voltage (Vcc) is sufficient, the transistors 66a and 70a conduct.

Thus, the activation circuit 40a, in one embodiment, is not triggered until the supply voltage has reached a level sufficient to activate both transistors 66a and 70a. At this point the supply voltage should have reached a voltage level greater than two N-channel transistor threshold voltages or in one embodiment approximately 1.4 volts.

When the activation circuit 40a turns on, it shorts the capacitor node 53a in the ensuing capacitor circuit 44. In particular, the node 53a is pulled harder towards ground. This pulls the output 47b harder towards ground and tends to latch the pulse generator 16 in its deactived state. In one embodiment, the transistor 70a may be stronger than the transistor 58.

Likewise, the circuit 40b, shown in FIG. 8, receives the low input 55b and provides it to the gate of a P-channel transistor 66b. The P-channel transistor 66b turns on and turns on the transistor 70b when the threshold voltages of the transistors 66b and 70b are exceeded. When this happens, the transistor 70b decouples the capacitor 64 from the rest of the circuit and effectively latches a high output 47a through the node 53b.

Thus, the circuits shown in FIGS. 7 and 8 tend to latch the capacitor circuits 44 (shown in FIG. 6) into their deactivated states (indicating that the output pulse is no longer needed). In particular, the circuits 40 make it harder to retrigger the pulse generator 16 prior to a power cycle.

Latching the critical nodes 53 from one threshold voltage above Vss to Vss may increase noise immunity in some embodiments. This may be useful, for example, for noise protection in low voltage applications, such as 0.7 volt applications. When the supply capacitor 56 is connected through a diode connected transistor 58 to ground, noise on the voltage supply (Vcc) can cause the diode node 53a to bounce. This bouncing can trigger a stage 48. The likelihood of this occurring may be reduced by using the latching operation in one embodiment.

Likewise, the capacitors 56 and 64 may be switched to the supply voltage and may be used as decoupling capacitors on the voltage supply in one embodiment. This decoupling may reduce supply noise. In addition, without the feedback 55, current may pass through the diode/capacitor 56 combination in the circuit 44. This current may increase the power consumption under supply noise. By shorting the diode connected transistor 58, this power consumption may be reduced.

The use of two threshold voltage activation circuits 40 may, in some embodiments, make it less likely that the latching starts prior to the time when the logic is operational (one threshold voltage). In addition, the charging capacitors 56 and 64 are typically used for the power-on reset application only. In the embodiment shown in FIGS. 5 through 8, the capacitors 56 and 64 may also be used for supply decoupling. Therefore, the same component may be utilized for two different purposes, reducing layout overhead, in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   determining whether logic in a functional block is in a predetermined, initial state;
   releasing the logic to begin operation after a supply voltage reaches a predetermined level and the logic is in its predetermined, initial state;
   generating a pulse until the supply voltage reaches the predetermined level, wherein the pulse steps from a low level to another level while undergoing a transition to a high level; and
   preventing a latch from thereafter changing state until the power supply voltage cycles again.

2. The method of claim 1 including generating a pulse to indicate that the supply voltage is ramping up.

3. The method of claim 2 including resetting said logic to its predetermined initial state in response to said pulse.

4. The method of claim 3 including indicating when said supply voltage has reached its predetermined level and providing a signal to a latch in response thereto.

5. The method of claim 4 including determining whether said logic is in its predetermined initial state and if so, providing a signal to said latch.

6. The method of claim 5 including generating a signal to reset said logic to its initial state and stopping the generation of said signal to reset said logic to its initial state after said logic has provided a signal to said latch indicating that the logic is in its predetermined initial state and the supply voltage has reached its predetermined level.

7. The method of claim 1 including testing the output of the functional block using decision logic which checks to determine whether the signals indicate that the logic is in its predetermined, initial state.

8. The method of claim 1 including generating a reset signal, in response to the ramping up of the supply voltage, that resets logic in the functional block to its predetermined, initial state.

9. The method of claim 1 including providing a reset signal to dynamic logic.

10. The method of claim 9 including preventing said dynamic logic from reactivating said reset signal.

11. An integrated circuit comprising:
    a functional block including logic to generate a plurality of signals;
    decision logic coupled to receive said signals to determine whether the functional block is in a predetermined, initial state and to generate an output signal indicative of whether the functional block is in the predetermined, initial state;
    a latch coupled to the output signal to generate a reset signal to reset the functional block to the predetermined, initial state, wherein said latch latches said reset signal in a deactivated state in response to the output signal indicating that the functional block is in the predetermined, initial state, and the reset signal in an activated state does not reset said functional block again until the power supply cycles again; and
    a pulse generator coupled to the latch to generate an output pulse until a supply voltage reaches a predetermined level, wherein the output pulse steps from a low level to another level while undergoing a transition to a high level.

12. The integrated circuit of claim 11 including a pulse generator to indicate that the supply voltage is ramping up.

13. The integrated circuit of claim 12 including dynamic logic in said functional block.

14. The integrated circuit of claim 13 wherein said latch prevents said dynamic logic from reactivating said reset signal.

15. The integrated circuit of claim 14 wherein said pulse generator enables the latch to generate a reset signal to said functional block logic and thereafter, said decision logic determines whether said functional block logic is in its predetermined, initial state.

16. An integrated circuit comprising:
    a power on reset pulse generator to generate an output pulse until the supply voltage reaches a predetermined level, wherein the output pulse steps from a low level to another level while undergoing a transition to a high level;
    a latch coupled to said generator to output a signal to reset the functional block to a predetermined, initial state;
    a functional block including the logic to generate a plurality of signals;
    decision logic coupled to receive said signals to determine whether the functional block is in the predetermined, initial state and to generate an output signal indicative of whether the functional block is in the predetermined, initial state; and
    wherein said latch responsive to the output signal, latches a reset signal wherein the reset signal does not reset said functional block until the power supply cycles again.

17. The integrated circuit of claim 16 wherein the output signal from said decision logic is coupled to said latch.

18. The integrated circuit of claim 16 including a functional block including logic, said circuit further including a latch to output a signal indicative of whether a supply voltage has reached a desired level and whether the logic in the functional block is in a predetermined, initial state.

19. The integrated circuit of claim 16 including a functional block including logic having a predetermined, initial state, the latch output signal coupled to said functional block logic.

20. The integrated circuit of claim 19 wherein said latch attempts to reset the functional block logic to the predetermined, initial state until the pulse generator pulse indicates that the supply voltage is at a predetermined initial level and the functional block logic is in its predetermined, initial state.

21. The integrated circuit of claim 20 wherein said latch latches the output of said latch in a deactivated state wherein the output of the latch does not reset the functional block logic until the power supply cycles again.

22. The integrated circuit of claim 21 wherein said functional block includes dynamic logic.

23. The integrated circuit of claim 22 wherein said latch prevents the dynamic logic from altering the output signal from said latch.

24. The integrated circuit of claim 23 wherein said pulse generator enables the latch to generate a reset signal to the functional block logic and thereafter determine whether the functional block logic is in the predetermined, initial state.

* * * * *